(12) United States Patent
Maruyama et al.

(10) Patent No.: US 6,717,469 B2
(45) Date of Patent: Apr. 6, 2004

(54) GAIN CONTROL CIRCUIT FOR CONTROLLING A GAIN IN A VARIABLE GAIN CELL

(75) Inventors: Takaya Maruyama, Tokyo (JP); Hisayasu Satoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 52 days.

(21) Appl. No.: 10/187,622

(22) Filed: Jul. 3, 2002

(65) Prior Publication Data

US 2003/0122623 A1 Jul. 3, 2003

(30) Foreign Application Priority Data

Dec. 28, 2001 (JP) .................................. 2001-401451

(51) Int. Cl.[7] ................................................ H03F 3/45
(52) U.S. Cl. ..................... 330/254; 330/256; 330/289
(58) Field of Search ................................ 330/254, 256, 330/257, 289; 327/346, 359, 83, 512, 513

(56) References Cited

U.S. PATENT DOCUMENTS 6,144,233 A * 11/2000 Maruyama et al. ............ 327/83

6,300,832 B1 * 10/2001 Okazaki ...................... 330/254

FOREIGN PATENT DOCUMENTS

JP    2000-269757    9/2000

* cited by examiner

*Primary Examiner*—Long Nguyen
(74) *Attorney, Agent, or Firm*—Burns, Doane, Swecker & Mathis, LLP

(57) ABSTRACT

A differential amplifier of an exponentially-changing current producing circuit has a pair of transistors of which bases are connected to each other through a differential base resistor of a resistance value R, a control current of a value $K_2 \times T - (K_1 \times K_2 \times T \times V_{cont}/K_3)$ produced from a gain control current $(K_1 \cdot V_{cont})$, a gain reference current $(K_3)$ and a bias current $(K_2 \cdot T)$ is fed to the base of one transistor, and an exponentially-changing current is output. $V_{cont}$ denotes a gain control voltage, $K_1$, $K_2$ and $K_3$ are constant, and T denotes an absolute temperature. An input signal is amplified in a variable gain cell at a gain corresponding to the exponentially-changing current, and an amplified signal is output. Therefore, the gain in the variable gain cell is controlled according to the exponentially-changing current.

6 Claims, 6 Drawing Sheets

GAIN CONTROL CIRCUIT FOR CONTROLLING A GAIN IN A VARIABLE GAIN CELL

BACKGROUND OF THE INVENTION

1. Field of the Invention

The present invention relates to a gain control circuit for controlling fluctuations of gain.

2. Description of Related Art

In a variable gain amplifier used for a radio communication system, it is desired that a gain obtained in the variable gain amplifier is exponentially changed with respect to a gain control voltage. Therefore, a conventional variable gain amplifier shown in FIG. 6 is, for example, used.

FIG. 6 is a constitutional view showing a conventional variable gain amplifier. In FIG. 6, 11 indicates a first voltage-to-current converter, 12 indicates a temperature characteristic compensating circuit, 13 indicates an exponentially-changing current producing circuit, 14 indicates a variable gain cell, 15 indicates a second voltage-to-current converter, and 16 indicates a temperature-proportional bias current generating circuit. A combination of the temperature characteristic compensating circuit 12 and the exponentially-changing current producing circuit 13 functions as a gain control circuit, and the exponentially-changing current producing circuit 13 has a differential amplifier 13a.

Next, an operation of the conventional variable gain amplifier will be described below.

Referring to FIG. 6, a gain control voltage $V_{cont}$ is applied to the first voltage-to-current converter 11, and the gain control voltage $V_{cont}$ is converted into a gain control current proportional to the gain control voltage $V_{cont}$. Here, a value of the gain control current is expressed by $K_1 \cdot V_{cont}$. $K_1$ denotes a proportional constant. Thereafter, the gain control current ($K_1 \cdot V_{cont}$) is fed to the temperature characteristic compensating circuit 12 according to a current mirror. Also, a bias current proportional to an absolute temperature T is generated in the temperature-proportional bias current generating circuit 16, and the bias current is fed to the temperature characteristic compensating circuit 12 according to a current mirror. The value of the bias current is expressed by $K_2 \cdot T$, and $K_2$ denotes a proportional constant.

Also, a reference voltage $V_{ref}$ fixed with respect to temperature is applied to the second voltage-to-current converter 15, and a gain reference current corresponding to the reference voltage $V_{ref}$ is produced. The value of the gain reference current is constant and is expressed by $K_3$. The gain reference current of the value $K_3$ is fed to the temperature characteristic compensating circuit 12 according to a current mirror.

As is described above, the gain control current ($K_1 \cdot V_{cont}$), the bias current ($K_2 \cdot T$) and the gain reference current ($K_3$) are respectively fed to the temperature characteristic compensating circuit 12 according to the current mirrors. This type of temperature characteristic compensating circuit 12 is equivalent to a temperature characteristic compensating circuit having a plurality of current sources generating the gain control current ($K_1 \cdot V_{cont}$), the bias current ($K_2 \cdot T$) and the gain reference current ($K_3$) respectively.

As shown in FIG. 6, the temperature characteristic compensating circuit 12 is composed of a group of a first transistor Q1, a second transistor Q2, a third transistor Q3, a fourth transistor Q4 and a group of a first current source 12a, a second current source 12b, a third current source 12c and a fourth current source 12d. Each of the transistors Q1 to Q4 is formed of an n-p-n transistor (or a first conductive type transistor). A differential amplifier is formed of both the second and third transistors Q2 and Q3. Here, the gain control current ($K_1 \cdot V_{cont}$) is generated in each of the first current source 12a and the fourth current source 12d, the gain reference current ($K_3$) is generated in the second current source 12b, and the bias current ($K_2 \cdot T$) is generated in the third current source 12c.

In the temperature characteristic compensating circuit 12, a base of the first transistor Q1 is connected to both a collector and a base of the fourth transistor Q4, and the first current source 12a is connected to the base of the first transistor Q1. The fourth current source 12d is connected to both an emitter of the fourth transistor Q4 and a base of the third transistor Q3. The second current source 12b is connected to both an emitter of the first transistor Q1 and a base of the second transistor Q2. The third current source 12c is connected to both an emitter of the second transistor Q2 and an emitter of the third transistor Q3. A first output current of a value $I_L$ is output from a collector of the second transistor Q2, and a second output current of a value $I_R$ is output from a collector of the third transistor Q3.

Therefore, the value $I_L$ of the first output current is expressed according to an equation (1).

$$I_L = K_1 \times K_2 \times T \times V_{cont} / K_3 \qquad (1)$$

Also, the value $I_R$ of the second output current is expressed according to an equation (2).

$$I_R = K_2 \times T - (K_1 \times K_2 \times T \times V_{cont} / K_3) \qquad (2)$$

The first output current of the value $I_L$ is fed to the exponentially-changing current producing circuit 13 according to a current mirror. Also, the bias current ($K_2 \cdot T$) is fed to the exponentially-changing current producing circuit 13 according to a current mirror (not shown). Therefore, the exponentially-changing current producing circuit 13 has current sources generating the first output current ($I_L$) and the bias current ($K_2 \cdot T$) respectively. The exponentially-changing current producing circuit 13 is composed of a differential amplifier 13a, a fifth current source 13b, a sixth current source 13c, a seventh current source 13d, a first resistor having a value $R_1$ and a second resistor having the value $R_1$. The differential amplifier 13a is composed of a pair of fifth transistor Q5 and sixth transistor Q6. Each of the transistors Q5 and Q6 is formed of an n-p-n transistor (or a first conductive type transistor). A base voltage is applied to the base of the fifth transistor Q5 through the first resistor, and a base voltage is applied to the base of the sixth transistor Q6 through the second resistor. The bias current ($K_2 \cdot T$) is generated in each of the fifth current source 13b and the sixth current source 13c, and the first output current ($I_L$) is generated in the seventh current source 13d. The bias current ($K_2 \cdot T$) generated in the fifth current source 13b is called a reference current of a value Ia, the bias current ($K_2 \cdot T$) generated in the sixth current source 13c is called a fixed current of a value Ie, and the first output current ($I_L$) generated in the seventh current source 13d is called a control current of a value Ic.

The fifth current source 13b of the reference current (Ia) is connected to a base of the fifth transistor Q5, the sixth current source 13c of the fixed current (Ie) is connected to both an emitter of the fifth transistor Q5 and an emitter of the sixth transistor Q6, and the seventh current source 13d of the control current (Ic) is connected to the base of the sixth transistor Q6. Also, the first resistor (R1) is connected to the base of the fifth transistor Q5, and the second resistor (R1) is connected to the base of the sixth transistor Q6. A third output current having a value $I_o$ is output from a collector of the fifth transistor Q5.

Because the value Ic of the control current is equal to the value $I_L$ of the first output current, the value Ic of the control current is expressed according to an equation (3) with reference to the equation (1).

$$Ic = K_1 \times K_2 \times T \times V_{cont} / K_3 \quad (3)$$
$$= K_2 \times T \times K_4 \times V_{cont}$$

Here, $K_4 = K_1/K_3$ is satisfied.

As shown in FIG. 6, in the exponentially-changing current producing circuit 13, a voltage proportional to a difference between the control current Ic and the reference current Ia is applied to the differential amplifier 13a as an input voltage. In short, a voltage having a value $R_1(Ic-Ia)$ is applied to the differential amplifier 13a as an input voltage.

Therefore, the value $I_o$ of the third output current is expressed according to an equation (4) with reference to the equation (3).

$$I_c = Ie / [1 + \exp\{R_1(Ic - Ia)/V_T\}] \quad (4)$$
$$= Ie / [1 + \exp\{R_1(K_2 \times T \times K_4 \times V_{cont} - Ia)/V_T\}]$$

Here, $V_T$ denotes a thermal voltage of a value kT/q·k denotes a Boltzmann's constant, and q denotes an elementary electric charge. The thermal voltage is almost equal to 25 mV at ordinary temperature.

As is apparent in the equation (4), in cases where the gain control voltage ($V_{cont}$) is low, the third output current ($I_o$) has an exponential function characteristic so as to be exponentially changed with respect to the gain control voltage ($V_{cont}$)

The third output current ($I_o$) is fed to the variable gain cell 14 according to a current mirror. Therefore, the variable gain cell 14 has a current source 14a in which the third output current ($I_o$) is generated. The variable gain cell 14 has a differential amplifier 14b composed of a seventh transistor Q7 and an eighth transistor Q8. Each of the transistors Q7 and Q8 is formed of an n-p-n transistor (or a first conductive type transistor). The current source 14a of the third output current ($I_o$) is connected to both an emitter of the seventh transistor Q7 and an emitter of the eighth transistor Q8.

When an alternating current input signal (ACinput) is fed to a base of the seventh transistor Q7 and a base of the eighth transistor Q8, an alternating current output signal (ACoutput) is output from a collector of the seventh transistor Q7 and a collector of the eighth transistor Q8. In this case, a gain (or a level ratio of the alternating current output signal to the alternating current input signal) in the variable gain cell 14 is proportional to the third output current ($I_o$), and the third output current ($I_o$) has the exponential function characteristic with respect to the gain control voltage ($V_{cont}$) in cases where the gain control voltage ($V_{cont}$) is low. Therefore, the gain in the variable gain cell 14 has the exponential function characteristic so as to be exponentially changed with respect to the gain control voltage ($V_{cont}$). In other words, in cases where the gain control voltage ($V_{cont}$) is low, a gain of the conventional variable gain amplifier shown in FIG. 6 has the exponential function characteristic so as to be exponentially changed with respect to the gain control voltage ($V_{cont}$).

FIG. 7 is a constitutional view showing another conventional variable gain amplifier. The constituent elements, which are the same as those shown in FIG. 6, are indicated by the same reference numerals as those of the constituent elements shown in FIG. 6, and additional description of those constituent elements is omitted.

In FIG. 7, 17 indicates an exponentially-changing current producing circuit of which the configuration differs from that of the exponentially-changing current producing circuit 13. Also, the variable gain cell 14 has a constant current source 14c in place of the current source 14a.

The exponentially-changing current producing circuit 17 has a pair of differential amplifiers 17a and 17b. The differential amplifier 17a is composed of a ninth transistor Q9 and a tenth transistor Q10, and the differential amplifier 17b is composed of an eleventh transistor Q11 and a twelfth transistor Q12. Each of the transistors Q9 to Q12 is formed of an n-p-n transistor (or a first conductive type transistor). The fifth current source 13b of the reference current (Ia) is connected to both a base of the tenth transistor Q10 and a base of the eleventh transistor Q11, and the seventh current source 13d of the control current (Ic) is connected to both a base of the ninth transistor Q9 and a base of the twelfth transistor Q12. Also, an emitter of the ninth transistor Q9 and an emitter of the tenth transistor Q10 are respectively connected to a collector of the seventh transistor Q7 of the variable gain cell 14, and an emitter of the eleventh transistor Q11 and an emitter of the twelfth transistor Q12 are respectively connected to a collector of the eighth transistor Q8 of the variable gain cell 14. Also, a collector of the tenth transistor Q10 is connected to a first load resistor having a resistance value $R_L$, and a collector of the eleventh transistor Q11 is connected to a second load resistor having the resistance value $R_L$. Also, a base voltage is applied to the bases of the ninth transistors Q9 and Q12 through a resistor having a resistance value $R_1$.

As is described with reference to FIG. 6, the alternating current input signal (ACinput) is fed to the variable gain cell 14. Also, the alternating current output signal (ACoutput) is output from a collector of the tenth transistor Q10 and a collector of the eleventh transistor Q11. A gain Av of the variable gain cell 14 is indicated by a level ratio |ACoutput|/|ACinput|. The gain Av is expressed according to an equation (5).

$$Av = g_m \times R_L \times [1 / \{1 + \exp(R_1(Ic - Ia)/V_T)\}] \quad (5)$$
$$= g_m \times R_L \times [1 / \{1 + \exp(R_1(K_2 \times T \times K_4 \times V_{cont} - Ia)/V_T)\}]$$

Here, $g_m$ denotes a transconductance of the differential amplifier 14b, and $R_L$ denotes a resistance value of each load resistor.

Therefore, in the conventional variable gain amplifier shown in FIG. 7, in cases where the gain control voltage ($V_{cont}$) is low, the gain of the variable gain cell 14 has an exponential function characteristic so as to be exponentially changed with respect to the gain control voltage ($V_{cont}$).

However, because the conventional variable gain amplifier shown in FIG. 6 and the conventional variable gain amplifier shown in FIG. 7 respectively have the above-described configuration, in cases where fluctuations occur in the reference current Ia generated by the fifth current source 13b, a problem has arisen that the gain of each conventional variable gain amplifier is considerably changed. For example, with reference to the equation (4), the third output current ($I_o$) is exponentially changed with the reference current Ia. Therefore, as shown in FIG. 8, in cases where fluctuations occur in the reference current Ia generated by the fifth current source 13b, the third output current ($I_o$) is exponentially changed regardless of the gain control voltage ($V_{cont}$) in the conventional variable gain amplifier shown in FIG. 6. Therefore, in cases where fluctuations occur in the reference current Ia, the gain of the conventional variable gain amplifier shown in FIG. 6 is exponentially changed regardless of the gain control voltage ($V_{cont}$). In contrast, because the sixth current source 13c of the fixed current (Ie) functions as a fixed current source of the differential amplifier 13a, as is apparent in the equation (4), the third output current ($I_o$) is proportional to the fixed current (Ie). Therefore, even though fluctuations occur in the fixed current (Ie) generated in the sixth current source 13c, the third output current ($I_o$) is merely changed in proportion to the fixed current (Ie). Therefore, even though fluctuations occur in the fixed current (Ie), the gain of the conventional variable gain amplifier shown in FIG. 6 is not changed so much.

In the same manner, in cases where fluctuations occur in the reference current Ia of the fifth current source 13b in the conventional variable gain amplifier shown in FIG. 7, the gain of the conventional variable gain amplifier shown in FIG. 7 is exponentially changed regardless of the gain control voltage ($V_{cont}$).

Therefore, in cases where fluctuations occur in the reference current Ia, a problem has arisen that the gain of each conventional variable gain amplifier is considerably and exponentially changed.

SUMMARY OF THE INVENTION

An object of the present invention is to provide, with due consideration to the drawbacks of the conventional variable gain amplifiers, a gain control circuit which receives no influence of fluctuations of a reference current.

The object is achieved by the provision of a gain control circuit including exponentially-changing current producing means, in which a first differential amplifier composed of a pair of transistors is arranged and bases of the transistors are connected to each other through a base resistor, for receiving a control current of a value $K_2 \times T - (K_1 \times K_2 \times T \times V_{cont}/K_3)$ based on a gain control current ($K_1 \cdot V_{cont}$) a gain reference current ($K_3$) and a bias current ($K_2 \cdot T$) at the base of one transistor of the first differential amplifier, producing an exponentially-changing current corresponding to the control current and controlling a gain of a variable gain cell according to the exponentially-changing current.

Therefore, a reference current is not required. Accordingly, no influence of fluctuations of a reference current is received in the gain control circuit.

DETAILED DESCRIPTION OF THE PREFERRED EMBODIMENTS

Embodiments of the present invention will now be described with reference to the accompanying drawings.

Embodiment 1

Figure 1:
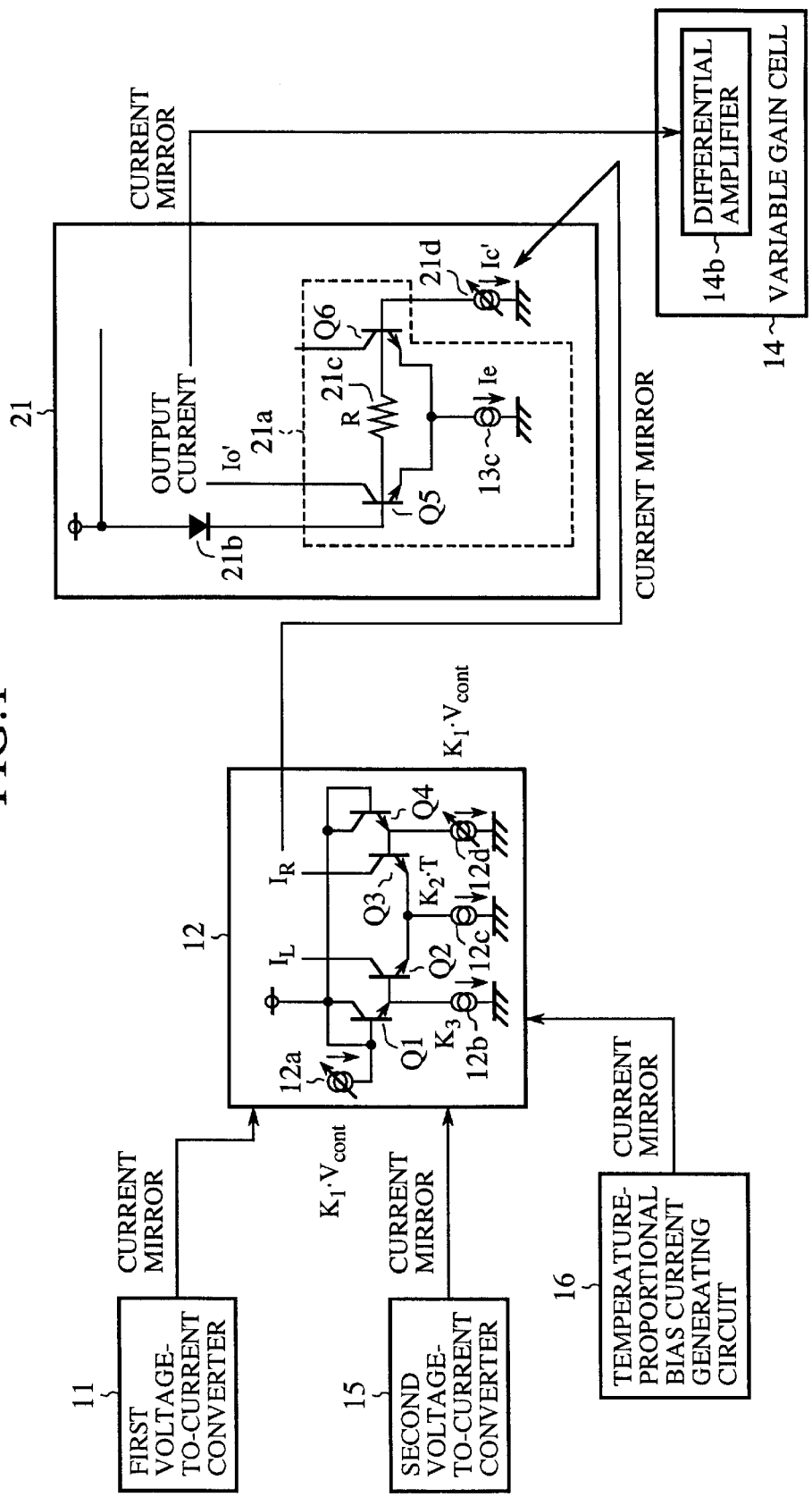
FIG. 1 is a constitutional view showing a variable gain amplifier according to a first embodiment of the present invention.
Figure 6:
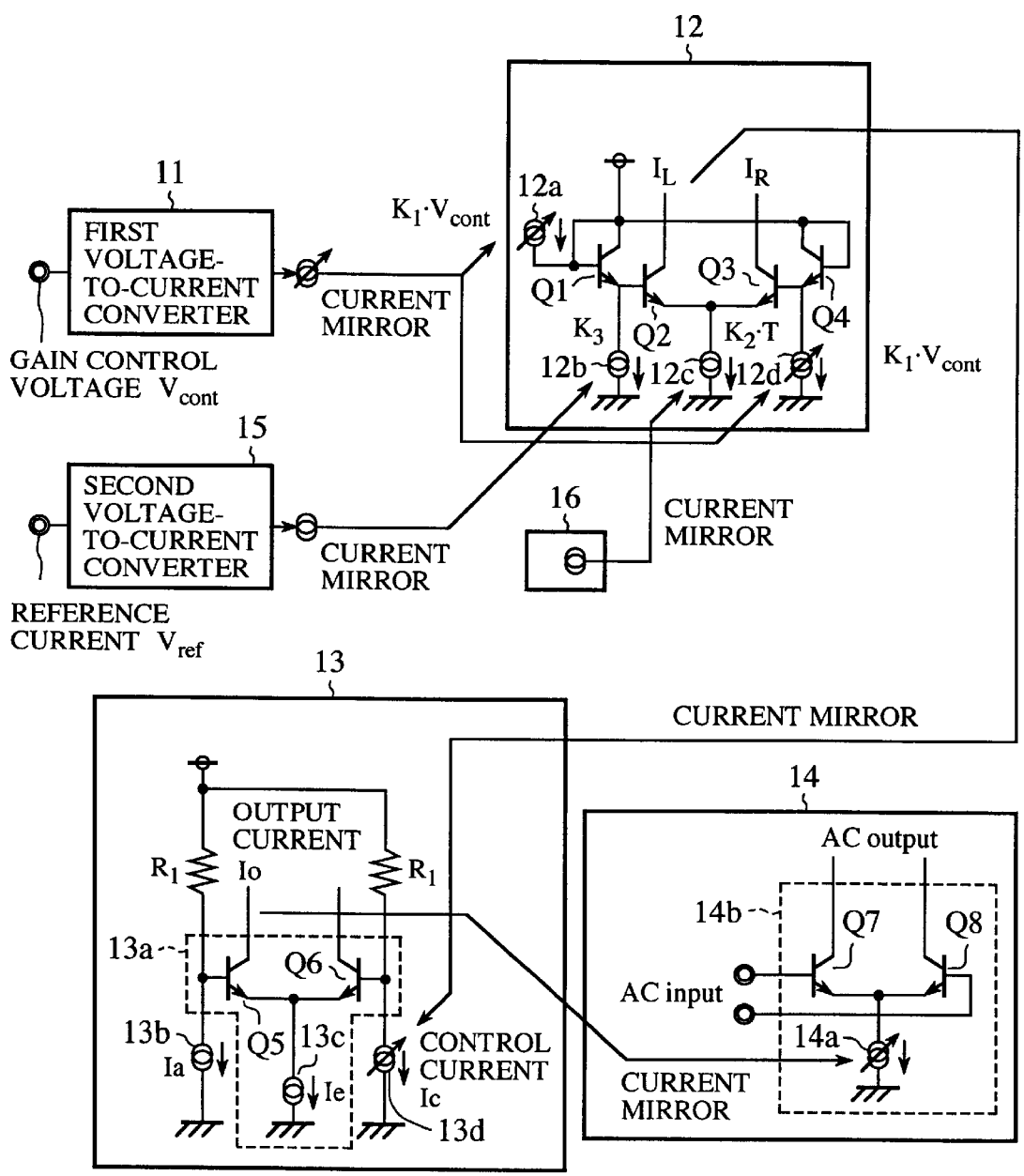
FIG. 6 is a constitutional view showing a conventional variable gain amplifier.

FIG. 1 is a constitutional view showing a variable gain amplifier according to a first embodiment of the present invention. The constituent elements, which are the same as those shown in FIG. 6, are indicated by the same reference numerals as those of the constituent elements shown in FIG. 6, and additional description of those constituent elements is omitted.

21 indicates an exponentially-changing current producing circuit (or exponentially-changing current producing means). The exponentially-changing current producing circuit 21 has a differential amplifier (or a first differential amplifier) 21a. A variable gain amplifier comprises the first voltage-to-current converter (or first voltage-to-current converting means) 11, the second voltage-to-current converter (or second voltage-to-current converting means) 15, the temperature-proportional bias current generating circuit (or temperature-proportional bias current generating means) 16, the temperature characteristic compensating circuit (or temperature characteristic compensating means) 12 having the differential amplifier (or a second differential amplifier) formed of both the second and third transistors Q2 and Q3, the exponentially-changing current producing circuit 21 and the variable gain cell 14 having the differential amplifier (or a third differential amplifier) 14b.

In the differential amplifier 21a of the exponentially-changing current producing circuit 21, a base voltage is applied to the base of the fifth transistor Q5 through a diode 21b, and the base of the fifth transistor Q5 is connected to the base of the sixth transistor Q6 through a differential base resistor (or a base resistor) 21c having a resistance value R. The sixth current source 13c of the fixed current (Ie) is connected to both the emitter of the fifth transistor Q5 and the emitter of the sixth transistor Q6.

A combination of the temperature characteristic compensating circuit 12 and the exponentially-changing current producing circuit 21 functions as a gain control circuit.

Next, an operation of the variable gain amplifier will be described below.

In the exponentially-changing current producing circuit 21, an eighth current source 21d is arranged in place of the seventh current source 13d arranged in the exponentially-changing current producing circuit 13, and an output current of a value $I_R$ is generated in the eighth current source 21d. In other words, the second output current ($I_R$) produced in the temperature characteristic compensating circuit 12 is fed to the exponentially-changing current producing circuit 21 according to a current mirror, and the eighth current source 21d of the second output current ($I_R$) is connected to the base of the sixth transistor Q6. The second output current generated in the eighth current source 21d is called a control current, and a value of the control current is expressed by Ic'. Thereafter, a fourth output current (or an exponentially-changing current) of a value $I_o'$ is output from the collector of the fifth transistor Q5, and the fourth output current ($I_o'$) is fed to the variable gain cell 14 in comparison with the third output current ($I_o$) fed to the variable gain cell 14 in the conventional variable gain amplifier shown in FIG. 6. Here, no reference current (Ia) is fed to the exponentially-changing current producing circuit 21.

As is described above, because the base of the fifth transistor Q5 is connected to the base of the sixth transistor Q6 through the differential base resistor 21c, the control current (Ic') flows through the differential base resistor 21c. Therefore, the value $I_o'$ of the fourth output current is expressed according to an equation (6).

$$I_o' = Ie/\{1 + \exp(R \times Ic'/V_T)\} \tag{6}$$

Because the relationship $Ic' = K_2 \times T - (K_1 \times K_2 \times T \times V_{cont}/K_3)$ is satisfied with reference to the equation (2), the equation (6) is rewritten to an equation (7).

$$I_o' = Ie/[1 + \exp\{R \times K_2 \times T(1 - K_4 \times V_{cont})/V_T\}] \tag{7}$$

As is apparent with reference to the equation (7), the fourth output current ($I_o'$) does not depend on the reference current (Ia) but changes with the gain control voltage ($V_{cont}$). Therefore, no influence of fluctuations of the reference current (Ia) is exerted on a gain obtained in the variable gain amplifier shown in FIG. 1.

As is described above, in the first embodiment, the base of the fifth transistor Q5 and the base of the sixth transistor Q6 are connected to each other through the differential base resistor 21c in the differential amplifier 21a of the exponentially-changing current producing circuit 21, and the control current Ic' is fed to the base of the sixth transistor Q6. Accordingly, because no reference current (Ia) is required in the exponentially-changing current producing circuit 21, no influence of fluctuations of the reference current (Ia) is exerted in the variable gain amplifier.

Embodiment 2

Figure 2:
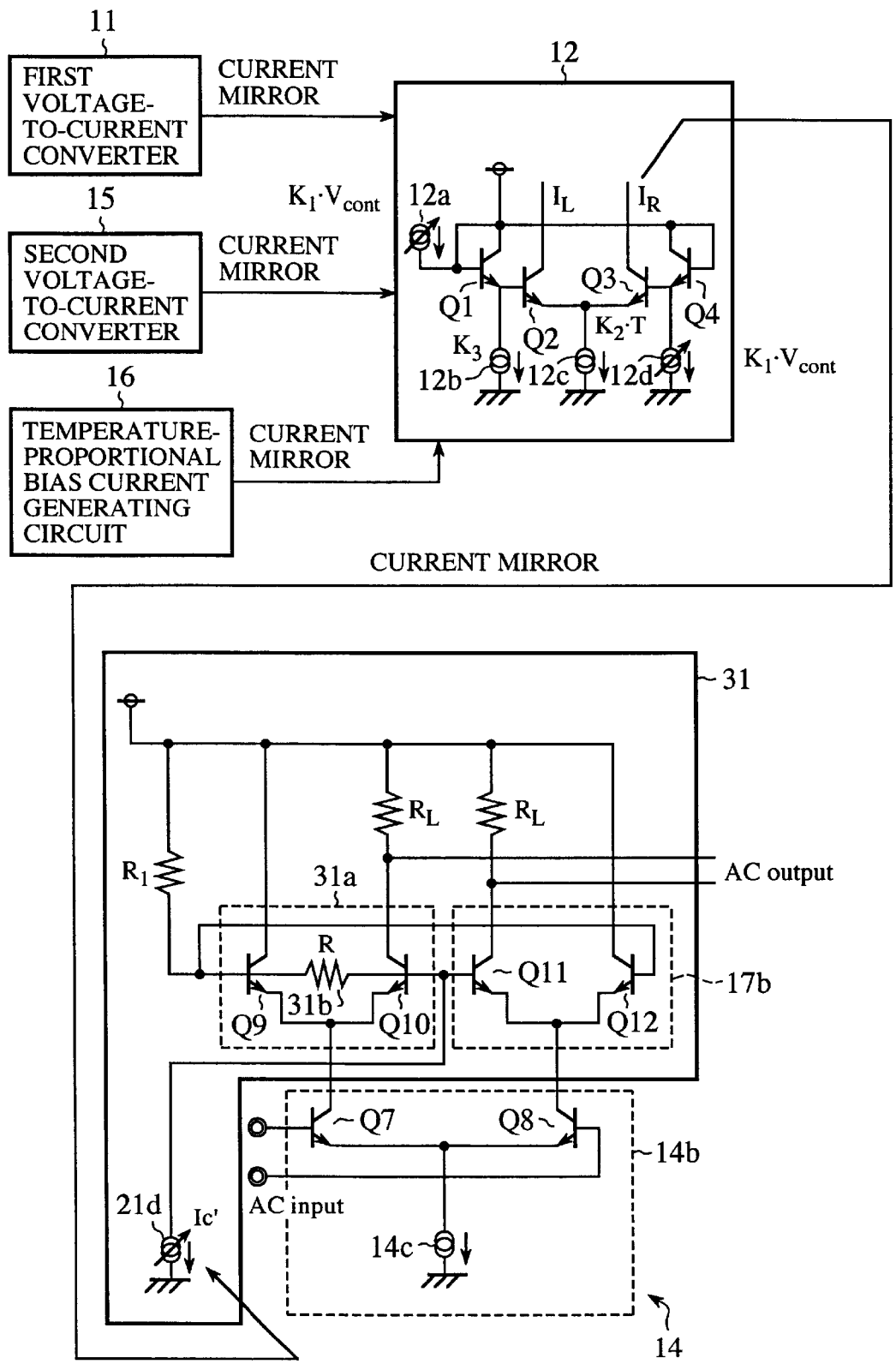
FIG. 2 is a constitutional view showing a variable gain amplifier according to a second embodiment of the present invention.
Figure 7:
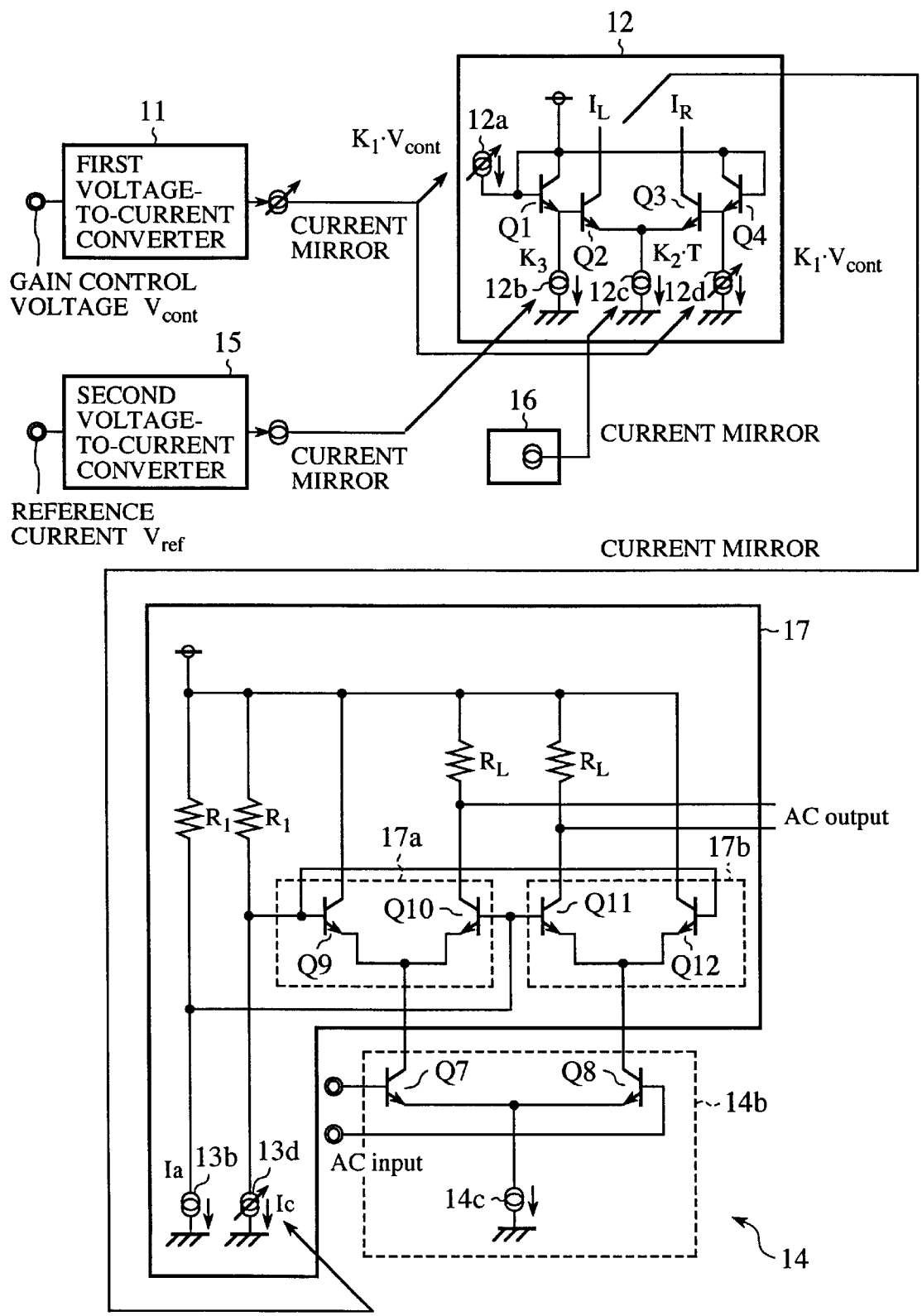
FIG. 7 is a constitutional view showing another conventional variable gain amplifier.

FIG. 2 is a constitutional view showing a variable gain amplifier according to a second embodiment of the present invention. The constituent elements, which are the same as those shown in FIG. 7, are indicated by the same reference numerals as those of the constituent-elements shown in FIG. 7, and additional description of those constituent elements is omitted.

31 indicates an exponentially-changing current producing circuit (or exponentially-changing current producing means). The exponentially-changing current producing circuit 31 has a differential amplifier (or a first differential amplifier) 31a. A variable gain amplifier comprises the first voltage-to-current converter (or first voltage-to-current converting means) 11, the second voltage-to-current converter (or second voltage-to-current converting means) 15, the temperature-proportional bias current generating circuit (or temperature-proportional bias current generating means) 16, the temperature characteristic compensating circuit (or temperature characteristic compensating means) 12 having the differential amplifier (or a second differential amplifier) formed of both the second and third transistors Q2 and Q3, the exponentially-changing current producing circuit 31 and the variable gain cell 14 having the differential amplifier (or a third differential amplifier) 14b.

In the differential amplifier 31a of the exponentially-changing current producing circuit 31, the base of the ninth transistor Q9 and the base of the tenth transistor Q10 are connected to each other through a differential base resistor (or a base resistor) 31b having a resistance value R. A combination of the temperature characteristic compensating circuit 12 and the exponentially-changing current producing circuit 31 functions as a gain control circuit.

Next, an operation of the variable gain amplifier will be described below.

In the same manner as in the conventional variable gain amplifier shown in FIG. 7, an alternating current input signal (ACinput) is fed to the bases of the transistors Q7 and Q8 of the differential amplifier 14b of the variable gain cell 14. Also, an alternating current output signal (ACoutput) is output from the collectors of the transistors Q10 and Q11 of the exponentially-changing current producing circuit 31. In the exponentially-changing current producing circuit 31, the seventh current source 13d of the exponentially-changing current producing circuit 17 shown in FIG. 7 is not used but the eighth current source 21d is arranged, and the second output current ($I_R$) is generated in the eighth current source 21d. In other words, the second output current ($I_R$) produced in the temperature characteristic compensating circuit 12 is fed to the exponentially-changing current producing circuit 31 according to a current mirror, and the eighth current source 21d of the second output current ($I_R$) is connected to the base of the tenth transistor Q10 and the base of the eleventh transistor Q11. The value of the second output current generated in the eighth current source 21d is expressed by Ic'. Here, no reference current (Ia) is fed to the exponentially-changing current producing circuit 31.

As is described above, because the base of the ninth transistor Q9 and the base of the tenth transistor Q10 are connected to each other through the differential base resistor 31b, a control current (Ic') of the eighth current source 21d flows through the differential base resistor 31b. Therefore, a gain Av obtained in the variable gain amplifier shown in FIG. 2 is expressed according to an equation (8). In this case, the relationship $Ic' = K_2 \times T - (K_1 \times K_2 \times T \times V_{cont}/K_3)$ is satisfied with reference to the equation (2).

$$\begin{aligned}Av &= g_m \times R \times [1/\{1 + \exp(R \times Ic'/V_T)\}] \\ &= g_m \times R \times [1/\{1 + \exp(R \times K_2 \times T \times (1 - K_4 \times V_{cont})/V_T)\}]\end{aligned} \tag{8}$$

Here, $g_m$ denotes a transconductance of the differential amplifier (or-third differential amplifier) 14b of the variable gain cell 14.

As is apparent with reference to the equation (8), the gain Av of the variable gain amplifier does not depend on the reference current (Ia) but changes with the gain control voltage ($V_{cont}$). Therefore, no influence of fluctuations of the reference current (Ia) is exerted on the gain Av of the variable gain amplifier.

As is described above, in the second embodiment, the base of the ninth transistor Q9 and the base of the tenth transistor Q10 are connected to each other through the differential base resistor 31b in the exponentially-changing current producing circuit 31, and the control current (Ic') of the eighth current source 21d is fed to the base of the tenth transistor Q10. Therefore, no reference current (Ia) is required in the exponentially-changing current producing circuit 31. Accordingly, no influence of fluctuations of the reference current (Ia) is exerted in the variable gain amplifier.

Embodiment 3

Figure 3:
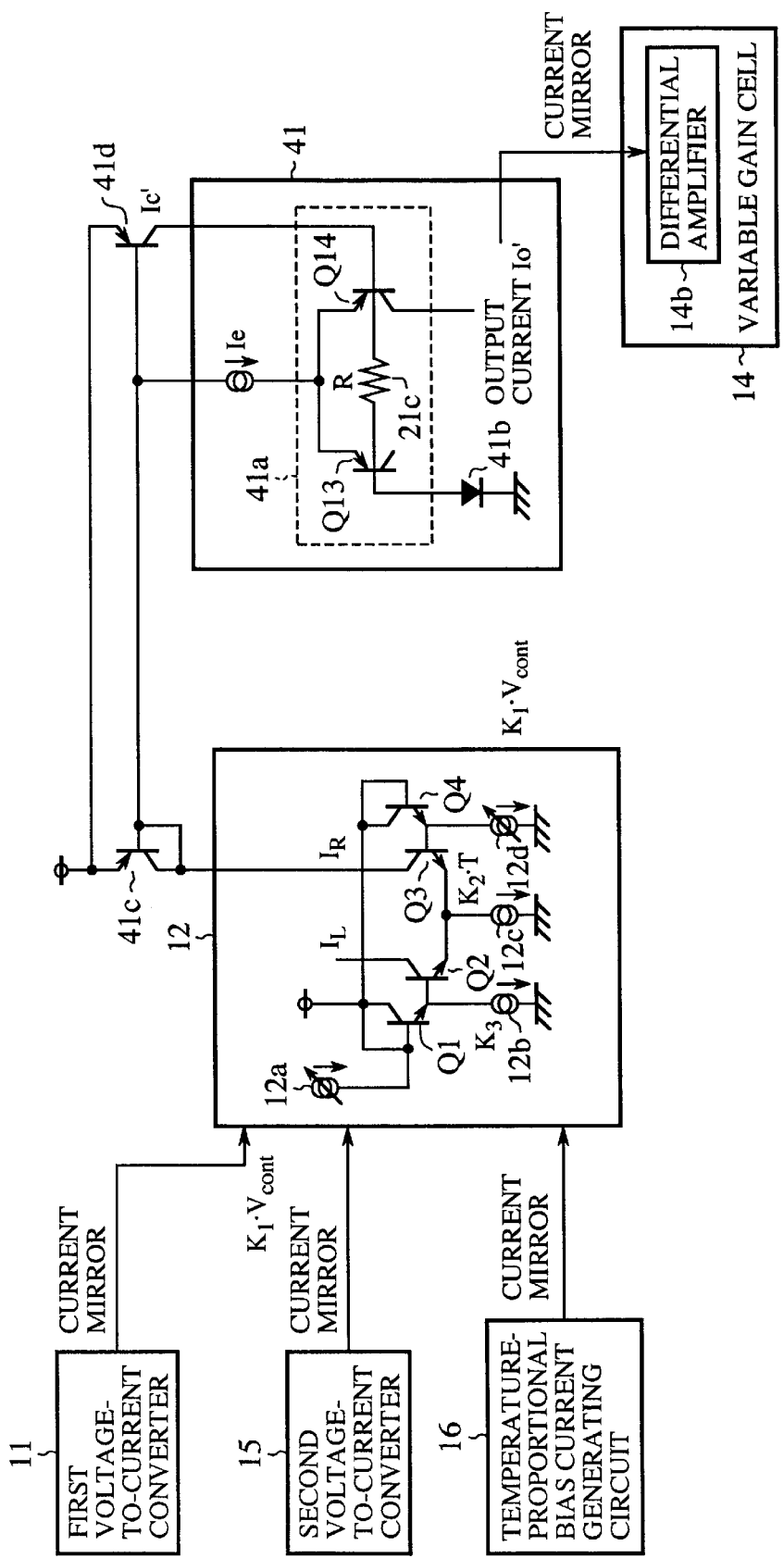
FIG. 3 is a constitutional view showing a variable gain amplifier according to a third embodiment of the present invention.

FIG. 3 is a constitutional view showing a variable gain amplifier according to a third embodiment of the present invention. The constituent elements, which are the same as those shown in FIG. 1, are indicated by the same reference numerals as those of the constituent elements shown in FIG. 1, and additional description of those constituent elements is omitted.

41 indicates an exponentially-changing current producing circuit (or exponentially-changing current producing means). The exponentially-changing current producing circuit 41 has a differential amplifier (or a first differential amplifier) 41a. The differential amplifier 41a is composed of a thirteenth transistor Q13, a fourteenth transistor Q14 and the differential base resistor 21c. Each of the transistors Q13 and Q14 is formed of a p-n-p transistor (or a second conductive type transistor). A base of the thirteenth transistor Q13 and a base of the fourteenth transistor Q14 are connected to each other through the differential base resistor 21c. The base of the thirteenth transistor Q13 is grounded through a diode 41b. A current source of a fixed current Ie is connected to both an emitter of the thirteenth transistor Q13 and an emitter of the fourteenth transistor Q14. The second output current ($I_R$) of the temperature characteristic compensating circuit 12 is fed to the base of the fourteenth transistor Q14 of the exponentially-changing current producing circuit 41 as a control current (Ic') according to a current mirror. The fourth output current ($I_o'$) flowing through a collector of the fourteenth transistor Q14 is fed to the variable gain cell 14 according to a current mirror, and a gain of the variable gain cell 14 is controlled according to the fourth output current ($I_o'$).

To feed the second output current ($I_R$) to the base of the fourteenth transistor Q14 as a control current (Ic') according to a current mirror, a current mirror circuit (or current mirror means) composed of a pair of p-n-p transistors (or second conductive type transistors) 41c and 41d is used. The bases of the p-n-p transistors 41c and 41d are connected to each other, the base and collector of the p-n-p transistor 41c are connected to each other, and the second output current ($I_R$) flows through the collector of the p-n-p transistor 41c.

The fixed current (Ie) is fed from a connection line connecting the bases of the p-n-p transistors 41c and 41d to the emitters of the transistors Q13 and Q14. The collector of the transistor 41d is connected to the base of the fourteenth transistor Q14, and the control current (Ic') is fed to the exponentially-changing current producing circuit 41 through the collector of the transistor 41d.

A combination of the temperature characteristic compensating circuit (or temperature characteristic compensating means) 12 and the exponentially-changing current producing circuit 41 functions as a gain control circuit.

The transistors Q1 to Q4 of the temperature characteristic compensating circuit 12 are formed of the n-p-n transistors, and the transistors Q5 and Q6 of the exponentially-changing current producing circuit 21 shown in FIG. 1 are formed of the n-p-n transistors. Therefore, to feed the second output current ($I_R$) of the temperature characteristic compensating circuit 12 to the exponentially-changing current producing circuit 21 through a current mirror circuit as a control current (Ic') according to the first embodiment, from a viewpoint of the direction of the control current (Ic'), it is required that the current mirror circuit has a pair of n-p-n transistors and a pair of p-n-p transistors. In other words, when the second output current ($I_R$) is fed from the temperature characteristic compensating circuit 12 to the exponentially-changing current producing circuit 21 as a control current (Ic') according to a current mirror, it is required to arrange a two-stage type current mirror circuit. In contrast, in the variable gain amplifier shown in FIG. 3 according to the third embodiment, because the transistors Q13 and Q14 of the exponentially-changing current producing circuit 41 are formed of the p-n-p transistors respectively, the second output current ($I_R$) of the temperature characteristic compensating circuit 12 can be fed to the exponentially-changing current producing circuit 41 as a control current (Ic') through the current mirror circuit composed of only the pair of p-n-p transistors 41c and 41d. Therefore, the number of constituent elements in the variable gain amplifier according to the third embodiment is smaller than that according to the first embodiment.

Accordingly, in the variable gain amplifier according to the third embodiment, because the exponentially-changing current producing circuit 41 has the difference amplifier 41a composed of the p-n-p transistors Q13 and Q14, the number of transistors in the current mirror circuit, which is arranged to feed the second output current ($I_R$) from the temperature characteristic compensating circuit 12 to the exponentially-changing current producing circuit 41 as a control current (Ic'), can be reduced.

As is described above, in the third embodiment, because the exponentially-changing current producing circuit 41 has the difference amplifier 41a composed of the p-n-p transistors Q13 and Q14, the number of transistors in the current mirror circuit can be reduced.

Embodiment 4

Figure 4:
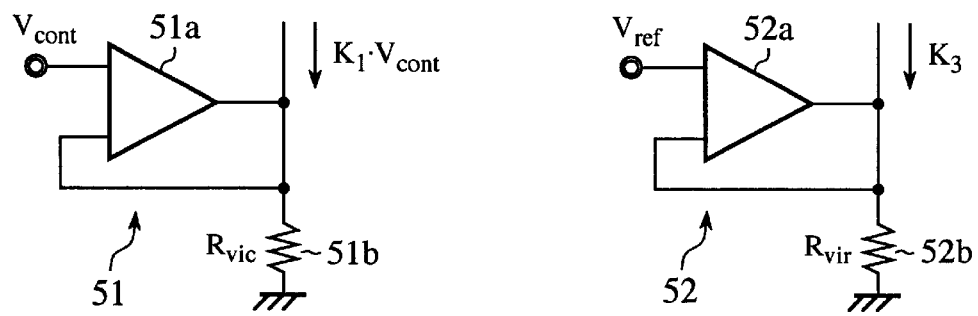
FIG. 4 is a constitutional view showing a first voltage-to-current converter and a second voltage-to-current converter used in a variable gain amplifier according to a fourth embodiment of the present invention.
Figure 5:
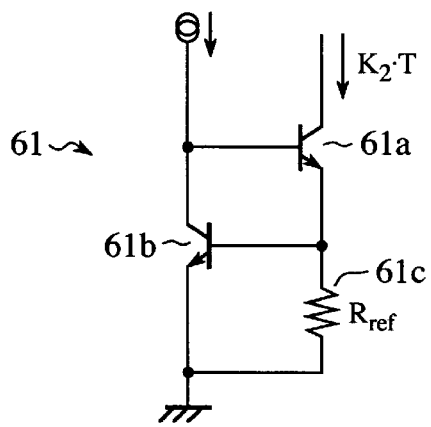
FIG. 5 is a constitutional view showing a temperature-proportional bias current generating circuit used in the variable gain amplifier according to the fourth embodiment of the present invention.
Figure 8:
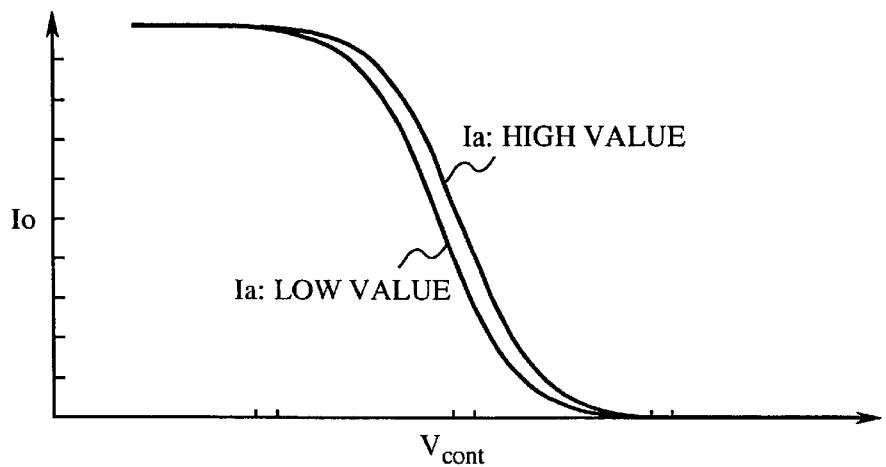
FIG. 8 shows the gain of the conventional variable gain amplifier shown in FIG. 6.

FIG. 4 is a constitutional view showing a first voltage-to-current converter and a second voltage-to-current converter used in a variable gain amplifier according to a fourth embodiment of the present invention. FIG. 5 is a constitutional view showing a temperature-proportional bias current generating circuit used in the variable gain amplifier according to the fourth embodiment of the present invention.

In FIG. 4, 51 indicates a first voltage-to-current converter, and 52 indicates a second voltage-to-current converter. The first voltage-to-current converter 51 has an operation amplifier 51a and a resistor (or a first resistor) 51b of a resistance value $R_{vic}$, and an output terminal of the operation amplifier 51a is grounded through the resistor 51b. A gain control current of a value $K_1 \cdot V_{cont}$ flows from the output terminal of the operation amplifier 51a to the resistor 51b. Therefore, the proportional constant $K_1$ is proportional to $1/R_{vic}$.

Also, the second voltage-to-current converter 52 has an operation amplifier 52a and a resistor (or a third resistor) 52b of a resistance value $R_{vir}$, and an output terminal of the operation amplifier 52a is grounded through the resistor 52b. A gain reference current of a value $K_3$ flows from the output terminal of the operation amplifier 52a to the resistor 52b. Therefore, the proportional constant $K_3$ is proportional to $1/R_{vir}$.

In FIG. 5, 61 indicates a temperature-proportional bias current generating circuit, and the temperature-proportional bias current generating circuit 61 has a transistor 61a, a transistor 61b and a resistor (or a second resistor) 61c of a resistance value $R_{ref}$. An emitter of the transistor 61a is connected to a base of the transistor 61b. A fixed current is fed to a base of the transistor 61a and a collector of the transistor 61b. The base of the transistor 61b is grounded through the resistor 61c. An emitter of the transistor 61b is grounded. A bias current ($K_2 \cdot T$) flows from a collector of the transistor 61a to the resistor 61c. Therefore, the proportional constant $K_2$ is proportional to $1/R_{ref}$.

Also, a temperature characteristic of the resistor 51b is the same as that of the resistor 52b, and a temperature characteristic of the resistor 61c is the same as that of the differential base resistor 21c shown in FIG. 1. Resistors having the same temperature characteristic as each other can be easily obtained by using the same type of resistors in a semiconductor integrated circuit.

Because the proportional constant $K_1$ is proportional to $1/R_{vic}$ and the proportional constant $K_3$ is proportional to $1/R_{vir}$, the constant $K_4$ (=$K_1/K_3$) in the equation (7) is proportional to $R_{vir}/R_{vic}$. Therefore, even though the resistance values $R_{vir}$ and $R_{vic}$ of the resistors 51b and 52b are changed with temperature, the temperature characteristic of the resistor 51b cancels out that of the resistor 52b, and the constant $K_4$ is independent of temperature. Also, because the proportional constant $K_2$ is proportional to $1/R_{ref}$, the term $R \cdot K_2$ in the equation (7) is proportional to $R/R_{ref}$. Therefore, even though the resistance values R and $R_{ref}$ of the differential base resistor 21c and the resistor 61c are changed with temperature, the temperature characteristic of the differential base resistor 21c cancels out that of the resistor 61c, and the term $R \cdot K_2$ is independent of temperature.

Accordingly, in cases where the first voltage-to-current converter 51, the second voltage-to-current converter 52 and the temperature-proportional bias current generating circuit 61 are used in place of the first voltage-to-current converter 11, the second voltage-to-current converter 15 and the temperature-proportional bias current generating circuit 16 respectively in the variable gain amplifier shown in FIG. 1, the temperature characteristics of the resistors used to obtain the fourth output current ($I_o'$) expressed according to the equation (7) are canceled out each other, and the terms $R \cdot K_2$ and $K_4$ in the equation (7) have no temperature dependency.

As is described above, in the fourth embodiment, the temperature characteristic of the resistor 51b of the first voltage-to-current converter 51 is set to be the same as that of the resistor 52b of the second voltage-to-current converter 52, the temperature characteristic of the resistor 61c of the temperature-proportional bias current generating circuit 61 is set to be the same as that of the differential base resistor 21c, and the first voltage-to-current converter 51, the second voltage-to-current converter 52 and the temperature-proportional bias current generating circuit 61 are used in place of the first voltage-to-current converter 11, the second voltage-to-current converter 15 and the temperature-proportional bias current generating circuit 16 respectively in the variable gain amplifier shown in FIG. 1. Therefore, the temperature characteristics of the resistors in the fourth output current ($I_o'$) can be canceled out each other, and the gain control can be performed in the variable gain amplifier without exponentially changing the gain due to the temperature characteristics of the resistors.

The fourth embodiment is not limited to the variable gain amplifier shown in FIG. 1. That is, in cases where the first voltage-to-current converter 51, the second voltage-to-current converter 52 and the temperature-proportional bias current generating circuit 61 are arranged in place of the first voltage-to-current converter 11, the second voltage-to-current converter 15 and the temperature-proportional bias current generating circuit 16 respectively in the variable gain amplifier shown in FIG. 2 or FIG. 3, the gain control can be performed in the variable gain amplifier without exponentially changing the gain due to the temperature characteristics of the resistors.

What is claimed is:

1. A gain control circuit, in which a gain in a variable gain cell is controlled according to a gain control current of a value $K_1 \cdot V_{cont}$ ($K_1$ denotes a proportional constant) corresponding to a gain control voltage $V_{cont}$, a gain reference current of a value $K_3$ corresponding to a reference voltage and a bias current of a value $K_2 \cdot T$ ($K_2$ denotes a proportional constant, and T denotes an absolute temperature), comprising:

temperature characteristic compensating means for producing a control current of a value $K_2 \times T - (K_1 \times K_2 \times T \times V_{cont}/K_3)$ according to the gain control current, the gain reference current and the bias current; and exponentially-changing current producing means, in which a first differential amplifier composed of a pair of transistors is arranged and bases of the transistors are connected to each other through a base resistor, for receiving the control current produced by the temperature characteristic compensating means at the base of one transistor of the pair of transistors of the first differential amplifier, for producing an exponentially-changing current corresponding to the control current and for controlling the variable gain cell according to the exponentially-changing current.

2. A gain control circuit according to claim 1, wherein a value of the exponentially-changing current produced by the exponentially-changing current producing means is expressed by $$K_2 \times T/[1+\exp\{R \times K_2 \times T(1-K_4 \times V_{cont})/V_T\}]$$

($K_4=K_1/K_3$, $V_T=kT/q$, k denotes a Boltzmann's constant, and q denotes an elementary electric charge, and R denotes a resistance value of the base resistor).

3. A gain control circuit according to claim 1, wherein the temperature characteristic compensating means comprises a second differential amplifier having a pair of first conductive type transistors; and a current mirror circuit, having a pair of second conductive type transistors, for providing the control current to the exponentially-changing current producing means according to a current output from the second differential amplifier, and wherein the pair of transistors of the first differential amplifier of the exponentially-changing current producing means are formed of the second conductive type transistors.

4. A gain control circuit according to claim 1, wherein the variable gain cell comprises a third differential amplifier, and the exponentially-changing current producing means controls the gain of the variable gain cell to $$g_m \times R \times [1/\{1+\exp(R \times K_2 \times T \times (1-K_4 \times V_{cont})/V_T)\}]$$

($K_4=K_1/K_3$, $V_T=kT/q$, k denotes a Boltzmann's constant, q denotes an elementary electric charge, $g_m$ denotes a transconductance of the third differential amplifier, and R denotes a resistance value of the base resistor) according to the exponentially-changing current.

5. A gain control circuit according to claim 2, wherein the proportional constant $K_1$ is inversely proportional to a resistance value of a first resistor used for the production of the gain control current from the gain control voltage, the proportional constant $K_2$ is inversely proportional to a resistance value of a second resistor used for the production of the bias current, the proportional constant $K_3$ is inversely proportional to a resistance value of a third resistor used for the production of the gain reference current from the reference voltage, a temperature characteristic of the first resistor is the same as that of the third resistor, and a temperature characteristic of the base resistor is the same as that of the second resistor.

6. A gain control circuit according to claim 4, wherein the proportional constant $K_1$ is inversely proportional to a resistance value of a first resistor used for the production of the gain control current from the gain control voltage, the proportional constant $K_2$ is inversely proportional to a resistance value of a second resistor used for the production of the bias current, the proportional constant $K_3$ is inversely proportional to a resistance value of a third resistor used for the production of the gain reference current from the reference voltage, and a temperature characteristic of the first resistor is the same as that of the third resistor, a temperature characteristic of the base resistor is the same as that of the second resistor.

* * * * *